United States Patent [19]
Flannagan et al.

[11] Patent Number: 6,044,036
[45] Date of Patent: Mar. 28, 2000

[54] BUFFER CIRCUIT, MEMORY DEVICE, AND INTEGRATED CIRCUIT FOR RECEIVING DIGITAL SIGNALS

[75] Inventors: Stephen T. Flannagan; William R. Weier, both of Austin, Tex.

[73] Assignee: Motorola, Inc., Schaumburg, Ill.

[21] Appl. No.: 09/078,159

[22] Filed: May 13, 1998

[51] Int. Cl.[7] .................................................. G11C 8/00
[52] U.S. Cl. .................. 365/230.08; 365/207; 365/205; 327/52
[58] Field of Search .............................. 365/230.08, 207, 365/205, 189.05; 327/52, 56

[56] References Cited

U.S. PATENT DOCUMENTS

| | | | |
|---|---|---|---|
| 5,032,797 | 7/1991 | Mijuskovic | 330/253 |
| 5,729,160 | 3/1998 | Allan | 365/230.08 X |
| 5,881,014 | 3/1999 | Ooishi | 365/189.09 |

OTHER PUBLICATIONS

Richard J. Reay et al., "An Unconditionally Stable Two–Stage CMOS Amplifier", IEEE Journal of Solid–State Circuits, vol. 30, No. 5, May 1995, pp. 391–394.

Harold Pilo et al., "FA 9.3: A 300MHHz, 3.3V 1Mb SRAM Fabricated in a 0.5u m CMOS Process", IEEE/1996 Buena VistaISSCC Slide Supplement, 5 pgs.

Primary Examiner—Huan Hoang
Attorney, Agent, or Firm—James L. Clingan, Jr.

[57] ABSTRACT

A buffer circuit (60) that includes a current source (74) having an output, the current source to provide a substantially constant current, a first differential amplifier (62), and a second differential amplifier (66). The current from current source 74 is shared by the first (62) and second (64) differential amplifiers.

10 Claims, 3 Drawing Sheets

BUFFER CIRCUIT, MEMORY DEVICE, AND INTEGRATED CIRCUIT FOR RECEIVING DIGITAL SIGNALS

FIELD OF THE INVENTION

The present invention relates to buffers, memory devices, and integrated circuits for receiving digital signals.

BACKGROUND OF THE INVENTION

Differential input buffers have been used in many digital devices, such as memory circuits. Generally, the differential buffer may amplify a voltage difference between an input signal and a reference level. However, in certain applications, a reference level input to the differential buffer may approach the level of the voltage power input to the differential buffer. As the reference level becomes closer to the voltage power input level, certain types of differential buffers provide less and less output voltage swing and eventually ceases to operate effectively. One such application is communication or processing devices using high speed transceiver logic (HSTL). Further, other types of differential buffers may have degraded operation as the reference level approaches the other power input level.

It would be desirable to provide a differential buffer that could successfully operate when the voltage reference level varies across a wider range to provide increased control and design flexibility. Accordingly, there is a need for an improved differential buffer for use in integrated circuits that receive digital signals, such as memory devices.

BRIEF DESCRIPTION OF THE DRAWINGS

While the invention is pointed out with particularity in the appended claims, other features of the invention are disclosed by the following detailed description in conjunction with the accompanying drawings, in which:

DETAILED DESCRIPTION OF THE PREFERRED EMBODIMENTS(S)

Figure 1:
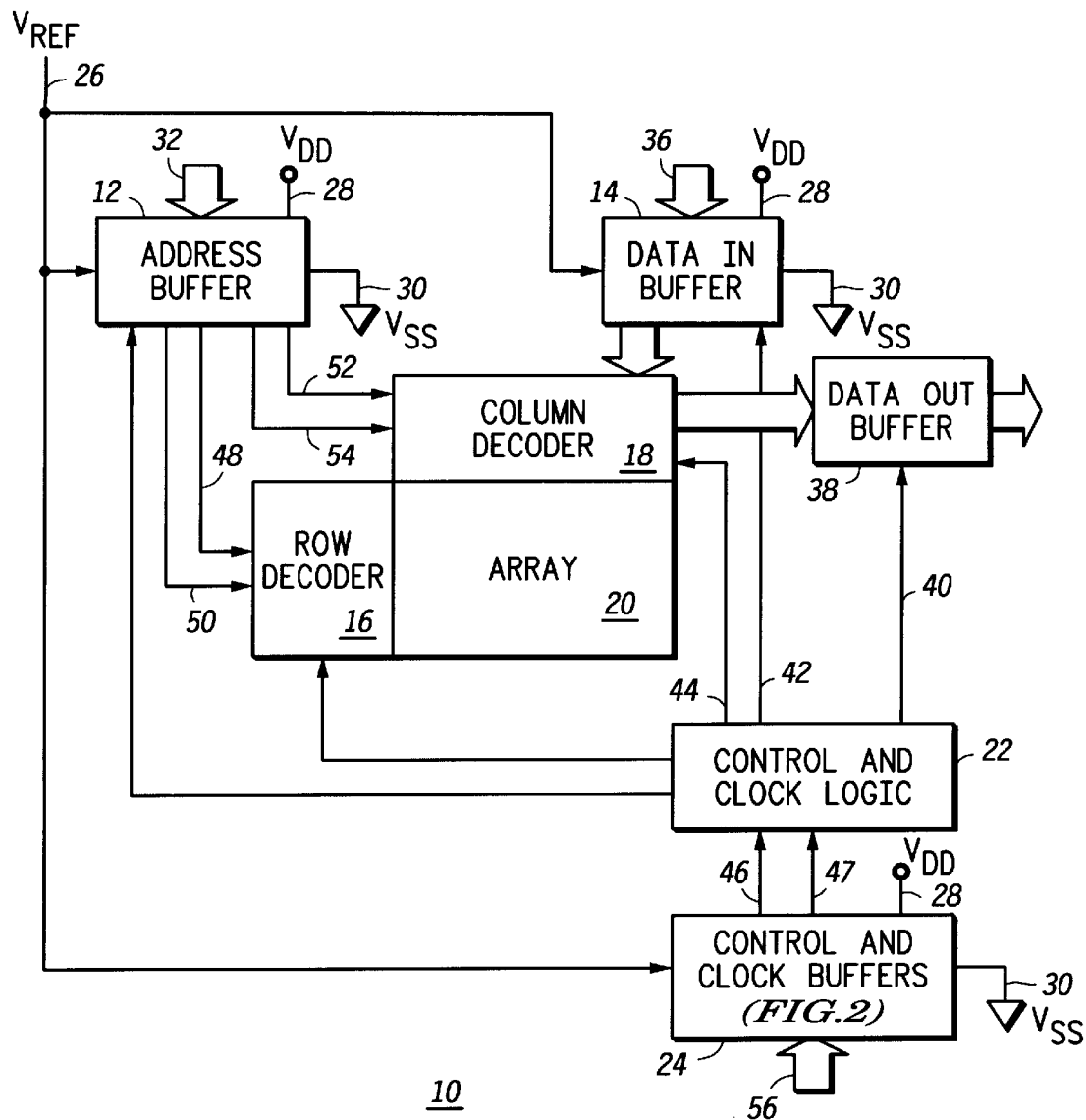
FIG. 1 is a block diagram of an embodiment of a digital logic device having a differential buffer in accordance with the present invention.

Generally, the present invention relates to an apparatus for handling digital signals. In accordance with a particular embodiment, the apparatus is a differential buffer circuit that includes a first differential amplifier, a first transistor, a second transistor, and a second differential amplifier. The first differential amplifier has gain elements comprised of transistors of a first conductivity type and has an internal current node, a first input terminal, a second input terminal, a first differential signal terminal, and a second differential signal terminal. The first transistor is of the first conductivity type and has a control electrode, a first current electrode coupled to the internal current node of the first differential amplifier, and a second current electrode coupled to the first differential signal terminal. The second transistor is of the first conductivity type and has a control elect rode, a first current electrode coupled to the internal current node of the first differential amplifier, and a second current electrode coupled to the second differential signal terminal. The second differential amplifier has gain elements comprised of transistors of a second conductivity type and has a first input terminal coupled to the first input terminal of the first differential amplifier, a second input terminal coupled to the second input terminal of the first differential amplifier, a first output coupled to the control electrode of the first transistor, and a second output coupled to the control electrode of the second transistor.

In accordance with another aspect of the present invention, the apparatus is a differential buffer circuit that includes a current source having an output, the current source to provide a substantially constant current; a first differential amplifier having an input for receiving current coupled to the output of the current source; and a second differential amplifier having an input for receiving current coupled to the output of the current source.

In accordance with another aspect of the present invention, the apparatus is an integrated circuit for receiving digital signals that includes a control circuit which performs digital operations; a plurality of input buffers for providing buffered signals to the control circuit in response to receiving the digital signals wherein each input buffer of the plurality of input buffers has a signal input terminal for receiving a predetermined one of the digital signals, a reference terminal for receiving a reference voltage, a pair of power supply terminals for receiving a power supply voltage within a predetermined range for powering the input buffer, and an output terminal which provides one of the buffered signals, wherein the reference voltage can be any voltage within the predetermined range of the power supply voltage.

In accordance with another aspect of the present invention, the apparatus is a memory device that includes an array of memory cells; a row decoder coupled to the array; a column decoder coupled to the array; and an address buffer. The address buffer provides buffered address signals to the row decoder and column decoder in response to receiving external address signals. The address buffer has a signal input terminal for receiving a predetermined one of the external address signals, a reference terminal for receiving a reference voltage, a pair of power supply terminals for receiving a first and second power supply voltage forming a power supply voltage range for powering the input buffer, and an output terminal which provides the buffered address signals. The reference voltage can be any voltage within the power supply voltage range.

In accordance with another aspect of the present invention, the apparatus is a buffer circuit that includes first means, having a first input terminal, for amplifying a signal at the first input terminal and having an output terminal; second means, having a second input terminal, for amplifying a signal at the second input terminal and having an output terminal coupled to the output terminal of the first means; and third means for level shifting the signal at the first input terminal and having an output coupled to the second input terminal.

It should be noted that the particular terms and expressions employed and the particular structural and operational details disclosed in the detailed description and accompanying drawings are for illustrative purposes only and are not intended to in any way limit the scope of the invention as described in the appended claims.

Referring to FIG. 1, an embodiment of a digital device, such as a memory device 10, using a differential buffer is disclosed. The digital device 10 includes an address buffer 12, a control buffer 24, a data input buffer 14, a data output buffer 38, a control and clock logic unit 22, a row decoder 16, a column decoder 18, and a memory array 20. Each of the input buffers 12, 24, 14, receive a first voltage power input VDD 28, a second voltage power input VSS 30, a reference voltage input 26, and a respective data signal input 32, 36, 56 for the address buffer 12, the data buffer 14, and the control buffer 24. The address buffer 12 provides address data 48, 50 to the row decoder 16 and provides address data 52, 54 to the column decoder 18. The Row decoder 16 and the column decoder 18 are also responsive to the control and clock logic unit 22 which receives a control signal 46 from the control buffer 24. The memory array 20 is addressed by the row decoder 16 and the column decoder 18 to receive data from the data input buffer 14 and to provide data to the data output buffer 38. Both the data input buffer 14 and the data output buffer 38 are responsive to the control and clock logic unit 22.

An important aspect of the digital device 10 is that the voltage reference signal 26 may vary across the entire range of values between the first voltage input 28 and the second voltage input 30. Further, the voltage reference level may even be higher than the first voltage input 28 or lower than the second voltage input 30. In many conventional devices, the buffers 12, 14, and 24 would not operate effectively as a differential input buffer when the reference voltage approached either the first voltage input level 28 or the second voltage input level 30. Thus, the above described digital device 10 has benefits over the conventional digital devices with conventional differential buffers.

Figure 2:
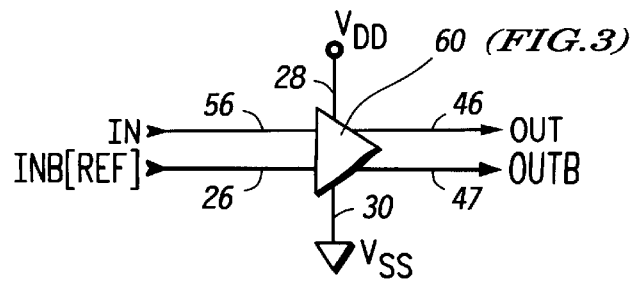
FIG. 2 is a general diagram of the control buffer of FIG. 1.

Referring to FIG. 2, a differential buffer 24, such as one of a plurality of input buffers within the control buffer 24, is illustrated. The buffer 24 includes an input 56, a reference input 26, a voltage supply input 28, a differential amplifier 60, a first output 46 and a second output 47. The differential amplifier 60 amplifies a difference between the input signal 56 and the reference level 26 to provide digital outputs 46 and 47 that have either a logic zero level or a logic one level. In certain applications, the difference between the input signal 56 and the reference signal 26 is about 200 millivolts and the difference between the voltage level for the logic zero and the logic one values is about 1.8 volts. In such an illustrative application, the power supply voltage 28 may be 1.8 volts. As discussed above, a benefit of the differential buffer 24 is that the reference voltage 26 may vary across the full range between the two power supply voltages 28 and 30.

Figure 3:
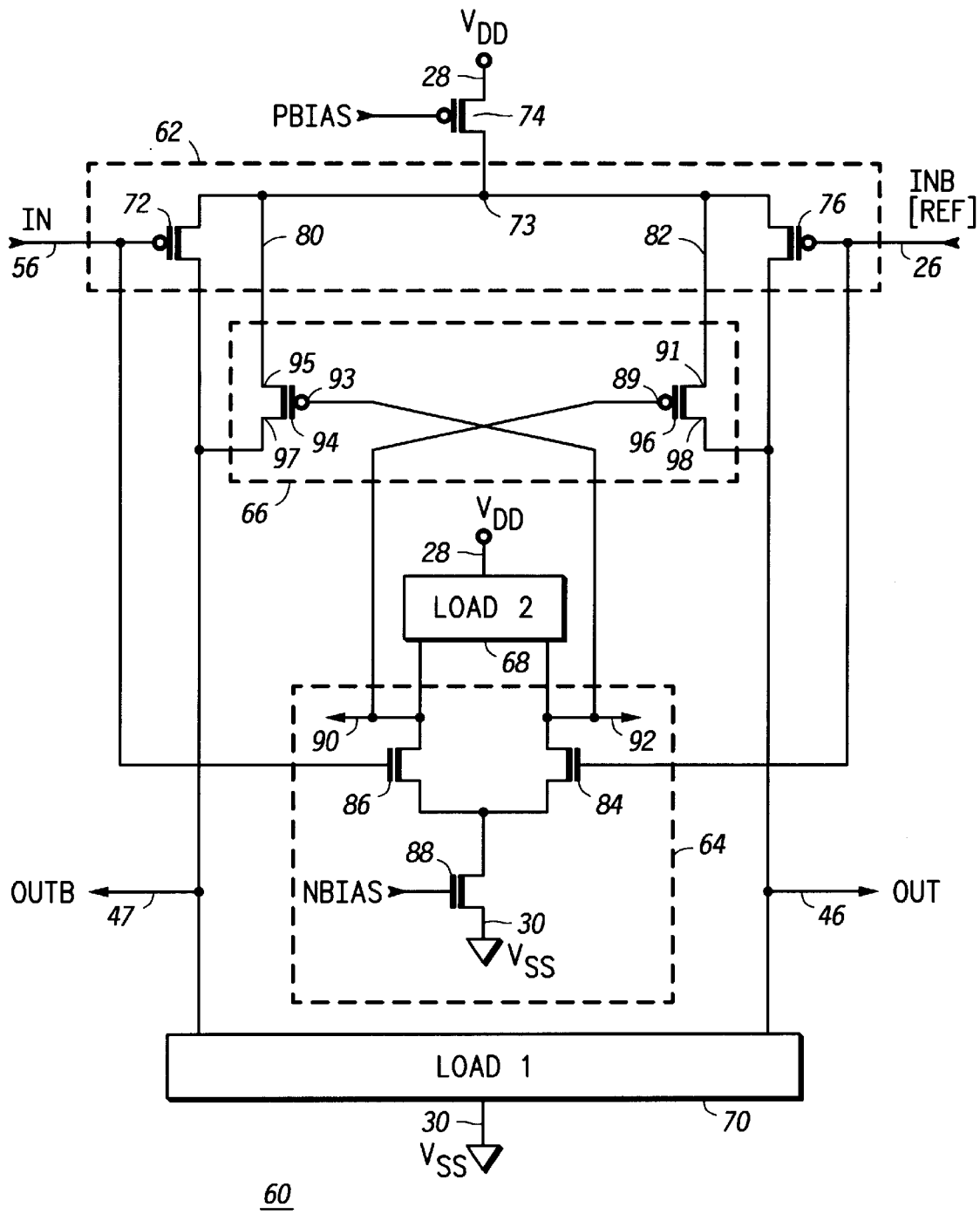
FIG. 3 is a circuit diagram of a particular embodiment of a differential buffer in accordance with the present invention.

Referring to FIG. 3, a particular illustrative embodiment of the differential input buffer 60 is disclosed. The differential input buffer 60 includes a first differential amplifier 62, a differential pair 66 that includes a first control transistor 94 and a second control transistor 96, a current source 74, and a second differential amplifier 64. The input buffer 60 further includes a first load 70 and a second load 68. The first differential amplifier 62 includes a first transistor 72, a second transistor 76, a first input terminal 56, a second input terminal 26, an internal node 73, a first differential signal terminal 47, and a second differential signal terminal 46. The current source 74 is coupled to the internal node 73 and provides a substantially constant current to the internal node 73. The first control transistor 94 has a control electrode 93, a first current electrode 95, and a second current electrode 97. The second control transistor 96 has a control electrode 89, a first current electrode 91, and a second current electrode 98. The first current electrodes 95, 91 are coupled to the internal node 73. The current electrode 97 is coupled to the first differential signal terminal 47 and the second current electrode 98 is coupled to the second differential signal terminal 46. The first transistor 72, the second transistor 76, the first control transistor 94, and the second control transistor 96 are each preferably of a first conductivity type. In a particular exemplary embodiment, the first conductivity type is a p-channel type of field effect transistor.

The second differential amplifier 64 has a first input terminal coupled to the input 56 a second input terminal coupled to the second input terminal 26, a first output 92 coupled to the control electrode 93 of the first control transistor 94, and a second output 90 coupled to the control electrode 89 of the second control transistor 96. The second differential amplifier 64 includes a fourth transistor 86, a fifth transistor 84, and a sixth transistor 88. The fourth, fifth, and sixth transistors 86, 84, 88 are each of a second conductivity type, and are preferably n-channel type field effect transistors.

During operation, the input buffer 60 operates in three different modes. In a first mode of operation, the first differential amplifier 62 is active and the second differential amplifier 64 is inactive. In this mode, the first input signal 56 is compared to the second input signal 26, such as a reference voltage signal, and a differential output is provided by the first differential amplifier 62 at the first differential signal terminal 47 and the second differential signal terminal 46. In a second mode of operation, the first differential amplifier 62 is inactive and the second differential amplifier 64 is active. In this mode of operation, the second differential amplifier 64 amplifies a difference between the first input 56 and the second input 26 to produce intermediate outputs 90 and 92. The control transistors 94 and 96 are then driven by the intermediate outputs 90 and 92 to provide the final signals 47 and 46. It should be noted that in the second mode of operation, that current is supplied via branches 80 and 82 from the current source 74 through the internal node 73 and that the second differential amplifier 64 provides a voltage level shifting function between its inputs 84, 86 and its outputs 90, 92.

In a third mode of operation, both the first and the second differential amplifiers 62, 64 are active and both differential amplifiers 62, 64 combine to amplify the input signals 56, 26 and provide output signals at the differential signal terminals 47 and 46. In the particular embodiment illustrated in FIG. 3, the input buffer 60 operates in the first mode of operation when the voltage reference 26 is at a relatively low level in comparison to the first voltage supply 28 and is relatively close to the level of the second voltage supply 30. The input buffer 60 operates in the second mode of operation when the reference input 26 is at a level relatively close to the first voltage supply 28 and is relatively far away from the second voltage supply 30. For example, if the first voltage supply 28 is 3.3 volts and the second voltage supply 30 is at 0 volts, then the input buffer 60 operates in the first mode of operation when the voltage reference 26 is between 0 and 2.6 volts and is in the second mode of operation when the voltage reference 26 is between 0.7 and 3.3 volts. When the reference voltage 26 is not approaching either of the first or second supply voltage level 28, 30 then the input buffer 60 is in the third mode of operation. By providing different differential amplifiers 62 and 64 having gain elements with different conductivity types to operate in response to varying voltage reference levels at the input 26, the input buffer 60 is able to advantageously operate over a wider range of voltage reference levels relative to the input supply voltages 28, 30, thereby providing improved overall performance.

Figure 4:
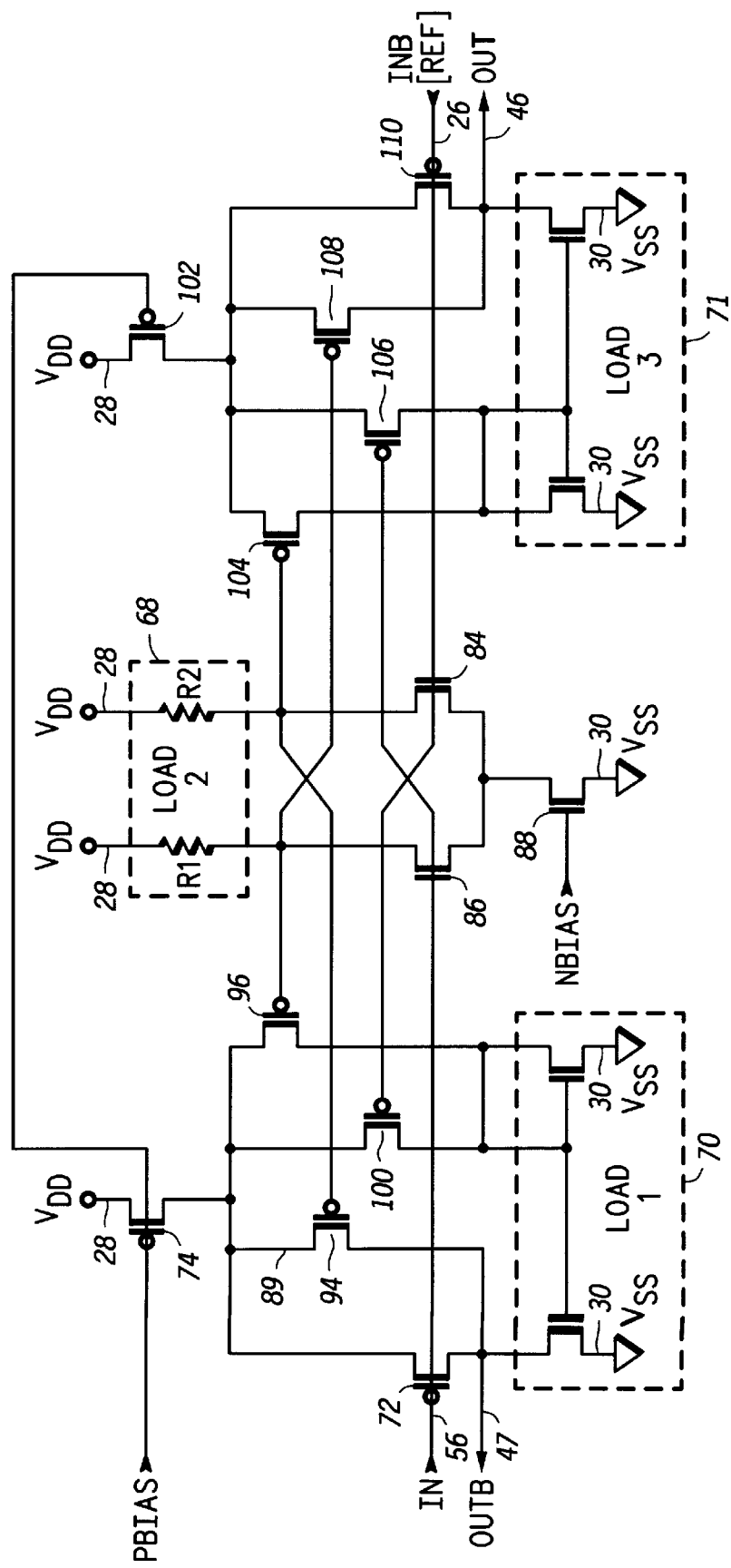
FIG. 4 is a circuit diagram of another particular embodiment of a differential buffer in accordance with the present invention.

Referring to FIG. 4, another embodiment of an input buffer in accordance with the present invention is illustrated. The input buffer disclosed in FIG. 4 includes many device elements that correspond to the elements of FIG. 3. All corresponding elements have been given the same reference number. The input buffer of FIG. 4 operates similarly as described above with respect to the input buffer 60 of FIG. 3. However, the input buffer of FIG. 4 has some additional elements and features that are described below.

The input buffer of FIG. 4 has used active transistor elements for the first load 70 and has used resistors for the second load 68. In addition, due to the active nature of the load 70, an additional transistor arrangement including transistors 104, 106, 108, and 110 was added. Further, an additional current source transistor 102 and an additional load 71 for the new transistor arrangement has been added. The current source transistor 102 is similar to the second transistor 74 described above with respect to FIG. 3. Transistors 104 and 108 perform a similar control function as the first and second control transistors 94 and 96, and transistor 110 performs a similar function as the third transistor 76 described above with respect to FIG. 3.

Thus, there has been described herein an embodiment including at least one preferred embodiment of a method and apparatus for providing a clocking signal. It will be apparent to those skilled in the art that the disclosed subject matter may be modified in numerous ways and may assume many embodiments other than the preferred form specifically set out and described above. For example, in an alternative embodiment, bipolar transistors may be interposed between the outputs 90, 92 of the second differential amplifier 64 and the control electrodes 93, 89 of the control transistors 94, 96 in the buffer circuit described in reference to FIG. 3.

Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A differential buffer circuit comprising:
    a first differential amplifier having gain elements comprised of transistors of a first conductivity type and having an internal current node, a first input terminal, a second input terminal, a first differential signal terminal, and a second differential signal terminal;
    a first transistor of the first conductivity type having a control electrode, a first current electrode coupled to the internal current node of the first differential amplifier, and a second current electrode coupled to the first differential signal terminal;
    a second transistor of the first conductivity type having a control electrode, a first current electrode coupled to the internal current node of the first differential amplifier, and a second current electrode coupled to the second differential signal terminal; and
    a second differential amplifier having gain elements comprised of transistors of a second conductivity type and having a first input terminal coupled to the first input terminal of the first differential amplifier, a second input terminal coupled to the second input terminal of the first differential amplifier, a first output coupled to the control electrode of the first transistor, and a second output coupled to the control electrode of the second transistor.

2. The differential buffer circuit claim 1, wherein the first conductivity type is P channel and the second conductivity type is N channel.

3. The differential buffer circuit of claim 1, further comprising a first current source which provides a substantially constant current to the internal current node of the first differential amplifier.

4. The differential buffer circuit of claim 1, further comprising a first load responsive to the first differential amplifier and a second load responsive to the second differential amplifier.

5. The differential buffer circuit of claim 1, further comprising:
    a third differential amplifier having gain elements comprised of transistors of a first conductivity type and having an internal current node, a first input terminal, a second input terminal, a first differential signal terminal, and a second differential signal terminal;
    a third transistor of the first conductivity type having a control electrode coupled to the first output of the second differential amplifier, a first current electrode coupled to the internal current node of the third differential amplifier, and a second current electrode coupled to the first differential signal terminal of the third differential amplifier; and
    a fourth transistor of the first conductivity type having a control electrode coupled to the second output of the second differential amplifier, a first current electrode coupled to the internal current node of the third differential amplifier, and a second current electrode coupled to the second differential signal terminal of the third differential amplifier.

6. The differential buffer circuit of claim 5, wherein the first conductivity type is P channel and the second conductivity type is N channel.

7. The differential buffer circuit of claim 5, further comprising a first current source which provides a substantially constant current to the internal current node of the first differential amplifier and a second current source which provides a substantially constant current to the internal current node of the third differential amplifier.

8. The differential buffer circuit of claim 7, wherein the second differential amplifier provides a level shifting function.

9. A differential buffer circuit, comprising:
    a current source having an output, the current source to provide a substantially constant current;
    a first differential amplifier having an input for receiving current coupled to the output of the current source; and
    a second differential amplifier having an input for receiving current coupled to the output of the current source;
    wherein the first differential amplifier comprises:
        a first transistor having a terminal coupled to a first output of the second differential amplifier and having an output coupled to a first output of the first differential amplifier; and
        a second transistor having a terminal coupled to a second output of the second differential amplifier and having an output coupled to a second output of the first differential amplifier.

10. A memory device comprising:
    an array of memory cells;
    a row decoder coupled to the array;
    a column decoder coupled to the array; and
    a plurality of buffers for providing buffered signals to the row decoder and column decoder in response to receiving external address signals wherein each of the plurality of buffers comprises:

a current source having an output, the current source to provide a substantially constant current;

a first differential amplifier having an input for receiving current coupled to the output of the current source; and a second differential amplifier having an input for receiving current coupled to the output of the current source;

wherein each of the plurality of buffers further comprises:

a first transistor having a terminal coupled to a first output of the second differential amplifier and having an output coupled to a first output of the first differential amplifier; and a second transistor having a terminal coupled to a second output of the second differential amplifier and having an output coupled to a second output of the first differential amplifier.

* * * * *